US008692231B2

(12) United States Patent
Matsui et al.

(10) Patent No.: US 8,692,231 B2
(45) Date of Patent: Apr. 8, 2014

(54) FUNCTIONAL MOLECULAR ELEMENT AND FUNCTIONAL MOLECULAR DEVICE (75) Inventors: Eriko Matsui, Kanagawa (JP); Nobuyuki Matsuzawa, Tokyo (JP); Akio Yasuda, Esslingen (DE); Oliver Harnack, Stuttgart (DE)

(73) Assignees: Sony Corporation, Tokyo (JP); Sony Deutschland G.m.b.H., Cologne (DE)

( * ) Notice: Subject to any disclaimer, the term of this patent is extended or adjusted under 35 U.S.C. 154(b) by 986 days.

(21) Appl. No.: 11/571,136

(22) PCT Filed: Jun. 24, 2005

(86) PCT No.: PCT/JP2005/011669
§ 371 (c)(1),
(2), (4) Date: Feb. 21, 2007

(87) PCT Pub. No.: WO2006/001394
PCT Pub. Date: Jan. 5, 2006

(65) Prior Publication Data
US 2007/0241324 A1 Oct. 18, 2007

(30) Foreign Application Priority Data

Jun. 24, 2004 (JP) ................................ P2004-185829
Jun. 13, 2005 (JP) ................................ P2005-172628

(51) Int. Cl.
*H01L 35/24* (2006.01)
*H01L 29/08* (2006.01)
(52) U.S. Cl.
USPC .............................. 257/40; 977/708; 977/788
(58) Field of Classification Search
USPC ............. 600/407–480; 349/41; 977/708, 788; 257/40
See application file for complete search history.

(56) References Cited

U.S. PATENT DOCUMENTS

| 5,034,296 | A | * | 7/1991 | Ong et al. | .................... | 430/58.7 |
| 6,020,426 | A | * | 2/2000 | Yamaguchi et al. | ............ | 525/66 |
| 6,128,214 | A | | 10/2000 | Kuekes et al. | | |
| 6,256,767 | B1 | | 7/2001 | Kuekes et al. | | |
| 6,665,042 | B1 | * | 12/2003 | Marshall et al. | .............. | 349/166 |

(Continued)

FOREIGN PATENT DOCUMENTS

| JP | 11-001625 | 1/1999 |
| JP | 2001-316354 | 11/2001 |

(Continued)

OTHER PUBLICATIONS

Chen et al., "Large On-Off Ratios and Negative Differential resistance in a Molecular Electronic Device," Science, Nov. 19, 1999, vol. 286, pp. 1550-1552.

(Continued)

*Primary Examiner* — Joel Lamprecht
(74) *Attorney, Agent, or Firm* — K&L Gates LLP (57) ABSTRACT A functional molecular element exhibiting its function under the operation of an electrical field is provided. A compound is used in which a pendant molecule, formed by 4-pentyl-4'-cyanobiphenyl, exhibiting positive dielectric constant anisotropy or a dipole moment along the direction of the long axis of the molecule, is covalently bonded to an electrically conductive linear or film-shaped principal-axis molecule having a conjugated system. The pendant molecule is changed in its orientation on application of an electrical field to change the conformation to switch the electrical conductivity of the electrically conductive principal-axis molecule.

24 Claims, 9 Drawing Sheets

(56) References Cited

U.S. PATENT DOCUMENTS

| | | | |
|---|---|---|---|
| 2002/0024039 A1* | 2/2002 | Angelopoulos et al. | 252/500 |
| 2002/0075420 A1* | 6/2002 | Zhang et al. | 349/41 |
| 2002/0114557 A1 | 8/2002 | Zhang et al. | |
| 2004/0007758 A1 | 1/2004 | McCreery | |
| 2004/0013345 A1 | 1/2004 | Zhang et al. | |
| 2006/0081838 A1 | 4/2006 | Matsui et al. | |

FOREIGN PATENT DOCUMENTS

| | | |
|---|---|---|
| JP | 2002-363551 | 12/2002 |
| JP | 2003-209305 | 7/2003 |
| JP | 2003-218360 | 7/2003 |
| JP | 2004-088090 | 3/2004 |
| JP | 2003-209305 | 7/2006 |
| WO | 02/35580 | 5/2002 |
| WO | 2004/059756 | 7/2004 |

OTHER PUBLICATIONS

Reed et al., "Conductance of a Molecular Junction," Science, Oct. 10, 1997, vol. 278, pp. 252-254.

Trzaska et al., "Cooperative Chirality in Columnar Liquid Crystals: Studies of Fluxional Octahedral Metallomesogens," J. Am. Chem. Soc. 1999, vol. 121, pp. 2418-4519.

Jeandon et al., "Biladienones from the Photooxidation of a meso-gem-Disubstituted Phlorin: Crystal and Molecular Structures of the 3N + O Coordinated Nickel(II) and Copper(II) Complexes," Inorg. Chem. 2001, vol. 40, pp. 3149-3153.

Spasojevie et al., "Managanese(III) Billiverdin IX Dimethyl Ester: A Powerful Catalytic Scavenger of Superoxide Employing the Mn(III)/Mn(IV) Redox Couple," Inorg. Chem., 2001, vol. 40, pp. 726-739.

Mizutani et al., "Interconversion between Point Chirality and Helical Chirality Driven by Shape-Sensitive Interactions," J. Am. Chem. Soc. 1996, vol. 118, pp. 5318-5319.

Mizutani et al., "Helical Chirality Induction by Point Chirality at Helix Terminal," J. Am. Chem. Soc., 1999, vol. 121, pp. 754-759.

Mizutani et al., "Allosteric Chirality Amplification in Zinc Billinone Dimer," J. Am. Chem. Soc., 2000, vol. 122, pp. 748-749.

International Search Report dated Jun. 23, 2009, for corresponding Patent Application EP 05753301.0.

Translation of the International Preliminary Report (Chapter I) dated Jun. 24, 2005 for International Application No. PCT/JP05/011669 (5 pages).

* cited by examiner

FUNCTIONAL MOLECULAR ELEMENT AND FUNCTIONAL MOLECULAR DEVICE

CROSS REFERENCE TO RELATED APPLICATIONS

The present application claims priority to Japanese Patent Document Nos. P2004-185829 filed on Jun. 24, 2004, and P2005-172628 filed on Jun. 13, 2005, the disclosures of which are herein incorporated by reference.

BACKGROUND

The present application relates to a functional molecular device employing a functional molecular element exhibiting its functions under the operation of an electrical field.

In the field of a functional molecular element, realizing its functions under the action of an electrical field, researches are now being conducted for employing the nano-technology, which is a technology of observing, fabricating and utilizing a miniaturized structure with the size of the order of one hundred-millionth of a meter (10−8=10 nm).

Towards the end of eighties, a microscope of ultra-high precision, called a scanning tunneling microscope, was invented, whereby it became possible to observe individual atoms or molecules. With the use of the scanning tunneling microscope, not only may the atoms or molecules be observed, but also these may be handled individually. For example, a report has been made of an instance of arraying atoms in the form of a letter or character on the surface of a crystal. However, even though the atoms or molecules may be handled in this manner, it would not be practical to handle an enormous number of atoms or molecules one by one to assemble a new material or device.

If the atoms, molecules or groups thereof are handled to form a nanometer-scale structure, a new enabling ultra-precision machining technology is necessitated. This nanometer-scale ultra-fine machining technology may roughly be classified into the following two systems.

One of these systems is the so-called top-down system in which a silicon wafer of a larger size is machined to a small size to the limit of machining and an integrated circuit is formed thereon. This system has so far been used for the fabrication of a variety of semiconductor devices. The other is the so-called bottom-up system in which atoms or molecules, as the units of the miniscule size, are used as components, and a target nanometer-scale structure is fabricated by assembling these small components together.

As for the limit towards reducing the size of a structure in accordance with the top-down system, there is a famous Moore's law propounded in 1965 by Gordon E. Moore who is a joint founder of the Intel Corporation. This law states that the degree of transistor integration is doubled in eighteen months. Since 1965, the industrial circles of semiconductors succeeded in raising the degree of transistor integration for over thirty years, as predicted in the Moore's law.

The road map ITRS (International Technology Roadmap for Semiconductor), for the fifteen years to come, as publicized by the United States Semiconductor Industry Association (SIA), European Semiconductor Industry Association, Japan Electronics and Information Technology Industries Association, Korean Semiconductor Industry Association and Taiwan Semiconductor Industry Association, expresses an opinion that the Moore's law will continue to remain valid.

The ITRS is composed of a short-span road map, valid until 2013, and a long-span road map, valid until 2020. The short-span road map states that, in 2013, the process rule for the semiconductor chip and the gate length of a microprocessor will become 32 nm and 13 nm, respectively. The long-span road map states in 2020, the process role for the semiconductor chip and the gate length of a microprocessor will become 14 and 6 nm.

The more the semiconductor chip is miniaturized, the higher becomes its operating speed and the lower becomes the power consumption. Moreover, the number of components that may be produced from a sole wafer becomes larger, with the production cost being correspondingly lowered. This accounts for competition among microprocessor manufacturers for miniaturizing the process rule and for raising the integration degree of transistors.

In November 1999, a laboratory group of United States has clarified the results of epoch-making researches in the miniaturization technology. These researches are for a method of designing a gate on an FET (field-effect transistor), termed FinFET, developed by a group of Professor Chenming Hu specializing in the computer science in Berkeley School of the University of California, USA. This method enables a number of transistors, about 400 times as many as that of the conventional technology, to be fabricated on the semiconductor chip.

The gate is an electrode controlling the flow of electrons in the channel in an FET. In the currently accepted routine designing, the gate is placed on the semiconductor surface in a parallel relation thereto for controlling the channel from one side. With this structure, an electron flow cannot be interrupted except if the gate is of a length exceeding a certain length. Hence, the gate length has so far been taken to be among the factors restricting the miniaturization of the transistors.

With the FinFET, on the other hand, the gate is of a forked configuration lying on both sides of the channel in order to effectively control the channel. It is possible with the FinFET to further reduce the size of the gate length and the transistor than with the conventional transistor structure.

The gate length of a prototype FET, prepared by the laboratory group, is 18 nm, which is one-tenth of the currently accepted ordinary gate length. This gate length of the laboratory group compares favorably with the size for the year 2014 specified in the long-span road map of ITRS. It is stated that a gate length equal to one-half the above gate length may be possible. Since Professor Hu et al. states that they are not willing to acquire patent for the technology in expectation of wide acceptance in the semiconductor circles, it may be predicted that FinFET will be in the mainstream of the fabrication technique in future.

However, it has also been pointed out that the Moore's law will reach a limit by the law of nature sooner or later.

For example, in the semiconductor technology, now in the mainstream, a semiconductor chip is fabricated as a circuit pattern is printed on a silicon wafer by a lithographic technique. For raising the degree of miniaturization, the resolution has to be raised. For raising the resolution, it is necessary to put the technique of utilizing light of a shorter wavelength to practical use. Since physical limitations are imposed on the wavelength of light that can be exploited in the lithographic technology, there is necessitated a breakthrough from a different aspect in order to surmount the limitations imposed on the wavelength.

There is also fear that the quantity of heat evolved per semiconductor chip is excessively increased with increase in the degree of integration, thus possibly causing malfunctions or thermal destruction of the semiconductor chip.

In addition, according to experts' predictions, if the semiconductor circles continue their endeavor in reducing the ship size, investment or process costs are increased and, in conjunction with the lowered yield, the semiconductor industry will become inviable in ca. 2020.

As a new technology for making a breakthrough of the technological barrier inherent in the top-down system, the researches directed to endowing individual molecules with the functions as electronic components are stirring up notice. The target of these researches is an electronic device, such as molecular switch, formed by an individual molecule, and which is prepared in accordance with the bottom-up system.

Researches for fabricating a nanometer scale structure of metals, ceramics or semiconductors in accordance with the bottom-up system are also underway. However, if molecules, which are separate and independent from one another and which, in case the difference in shape or functions is taken into account, are of millions of species, are ingenuously exploited, it may be possible to re-design and fabricate the devices (molecular devices), having features totally different from those of the conventional devices, in accordance with the bottom-up system.

The width of an electrically conductive molecule is as small as 0.5 nm. With a linear array of these molecules, it is possible to achieve a wire having a density thousands of times higher than one of a line of a width of the order of 100 nm realized with the current integrated circuit technology. On the other hand, if a sole molecule is used as a storage element, the recording density as high as about one thousand times that of the DVD (Digital Video Disc) may be achieved.

The molecular device is synthesized by a chemical process, in a manner different from the case of a conventional semiconductor silicon. In 1986, a world's first organic transistor, formed of polythiophene, was developed by Yusi Koezuka of Mitsubishi Electric Co. Ltd., Japan.

On the other hand, an organic electronic device could be prepared with success by a laboratory group of the Hewlett-Packard (HP) of USA and the Los Angeles school of the University of California, and the report thereon was made in 'Science' in July 1999. The contents of the studies by the laboratory group are concretely disclosed in U.S. Pat. Nos. 6,256,767B1 and 6,128,214. The laboratory group fabricated switches, using molecular films of several millions of organic rotaxane molecules, and joined these molecular switches together to form an AND gate as a fundamental logic circuit.

On the other hand, a joint laboratory group of University of Rice and University of Yale of USA succeeded in fabricating a molecular switch in which a molecular structure is changed by electron implantation under application of an electrical field in order to perform a switching operation. The contents of the researches by the laboratory group are disclosed in J. Chen, M. A. Reed, A. M. Rawlett and J. M. Tour, "Large on-off ratios and negative differential resistance in a molecular electronic device", Science, 1999, Vol. 286, 1552-1551, and in J. Chen, M. A. Reed, C. Zhou, C. J. Muller, T. P. Burgin and J. M. Tour, "Conductance of a molecular junction", Science, 1997, Vol. 278, 252-254. The function of repeated on-off has not been accomplished by the group of the HP Inc. and the Los Angeles School of University of California.

The professor J. Tour, University of Rice, who is specializing in chemistry, and who succeeded in the synthesis, states that the production cost of the molecular switch may be one several-thousandth of that of the conventional system because no expensive clean room, ordinarily used for semiconductor fabrication, is required, and that a hybrid computer of molecules and silicon will be fabricated in five to ten years to come.

In 1999, the Bell Laboratories (Lucent Technology Inc.) fabricated an organic thin-film transistor, using a pentacene single crystal. This transistor was of characteristics which favorably compare with those of an inorganic semiconductor.

Even though the researches in a molecular device, having the function of an electronic component, are going on briskly, the researches so far made were mostly directed to driving with light, heat, protons or ions (see "Molecular Switches", WILEY-VCH, Weinheim, 200, edited by Ben L. Feringa), whilst only a limited number of the researches were directed to driving with an electrical field.

Meanwhile, the molecular elements, driven by the electrical field, so far proposed in the art, were only those exploiting the changes in the physical properties of the molecules themselves, caused under the influence by the electrical field. That is, the molecules themselves are thought of as single elements and the states of the electrons are varied by the electrical field. For example, in an organic FET, carrier migration in an organic molecule is modulated by changes in an electrical field acting on an organic molecule in a channel region.

SUMMARY

In view of the above-described status of the art, it is an object of the present application in an embodiment to provide a functional molecular element, the function of which is effectively controlled on the basis of a new principle, and a functional molecular device employing this functional element.

The present application provides in an embodiment a functional molecular element employing a system composed of a molecule exhibiting dielectric constant anisotropy and/or dipole moment and having the orientation changed under the operation of an electrical field and another molecule of a conjugated system having electrical properties changed as a result of a change in structure brought about by such change in orientation of the first molecule.

The present application also provides in an embodiment a functional molecular device including a system composed of a molecule exhibiting dielectric constant anisotropy and/or dipole moment and having the orientation changed under the operation of an electrical field, and another molecule of a conjugated system having electrical properties changed as a result of a change in structure brought about by the change in orientation of the first-stated molecule. The functional molecular device also includes electrical field applying means for applying an electrical field to the molecule exhibiting dielectric constant anisotropy and/or dipole moment, and input/output means for the other molecule of the conjugated system.

According to the present application in an embodiment, preferably the side chain formed by the first molecule, as a pendant molecule, exhibiting dielectric constant anisotropy and/or dipole moment, is covalently bonded to a main chain formed by the molecule of the conjugated system. In this configuration, the electrical characteristics of the functional molecular element, such as electrical conductivity, may be obtained by the molecule of the conjugate system. On the other hand, by the pendant molecule (side chain), exhibiting dielectric constant anisotropy and/or dipole moment, and which is changed in orientation under the field of the electrical field, the conformation of the molecule of the conjugated system (main chain) is effectively changed in keeping with changes in the electrical field, in such a manner that electrical characteristics are changed with high performance and with high electrical response characteristics.

With this element, the two functions, namely the demonstration of the electrical characteristics and modulation thereof by the electrical field, are taken charge of by respective distinct molecules. Hence, the materials best suited to the objective in view may be selected for the molecule of the conjugated system (main chain) and for the pendant molecule (side chain), so that it becomes possible to construct a functional molecular element capable of controlling the electrical characteristics to a high performance and to high electrical response characteristics.

Preferably, the pendant molecule is oriented on the electrode adapted for applying the electrical field, and the molecule of the conjugated system is arranged at least between the facing electrodes, with an output corresponding to the electrical field being taken from at least one of these facing electrodes.

Preferably, the electrically conductive path is formed by the molecule of the conjugated system, and electrical conductivity of the electrically conductive path is controlled by changes in the electrical field acting on the pendant molecule.

Preferably, the position relationships between the pendant molecule and the direction of the electrical field are changed by changes in the electrical field acting on the pendant molecule to cause changes in the steric configuration of the pendant molecule and the molecule of the conjugated system or in the angle defined between the two molecules.

Preferably, the layer of the molecule of the conjugated system and the layer of the molecule exhibiting the dielectric constant anisotropy and/or dipole moment form a stacked layer. In this case, an insulating layer may be formed on a first electrode, and a second electrode and a third electrode are formed on the insulating layer so that the second and third electrodes are not contacted with each other. The stacked layer may be arranged at least between the second and third electrodes. A fourth electrode may be arranged, either directly or via an insulating layer, on the layer of the molecule exhibiting the dielectric constant anisotropy and/or dipole moment of the stacked layer.

Preferably, the molecule of the conjugate system is a molecule having a fluorine skeleton, such as oligofluorene, whilst the pendant molecule is a molecule having a cyanobiphenyl skeleton, such as 4-pentyl-4'-cyanobiphenyl.

With the functional molecular element, and the functional molecular device, employing this functional molecular element, according to the present application, structural changes (changes in the conformance) of the molecule of the conjugated system are induced by changes in the orientation of the molecule exhibiting dielectric constant anisotropy and/or the dipole moment, whereby the electrical characteristics are modulated. This modulation may be realized with high electrical response performance because of covalent bonding of the molecule changed in orientation under the effect of the electrical field and the molecule of the conjugated system. In addition, changes in the conformation, brought about by the operation of the electrical field, may be realized at all times to high stability.

The above-described operating mechanism of the electrical field has been unprecedented in a conventional functional molecular element, such as field effect transistor, which has attempted to modulate the function of the element by directly controlling the state of electrons of the element by an electrical field. With the use of the new operating mechanism of the electrical field, it is possible to construct a functional molecular element capable of controlling the electrical characteristics with high response performance of the electrical field, and a functional molecular device employing the functional molecular element.

According to the present application in an embodiment, the functional molecular device includes a molecular device including a built-in functional molecular element.

Additional features and advantages of the present application are described in, and will be apparent from, the following Detailed Description and the figures.

BRIEF DESCRIPTION OF THE FIGURES

FIG. 1A shows the initial state, FIG. 1B shows an operating mode when an electrical field I is applied, and FIG. 1C shows an operating mode when an electrical field II is applied.

FIG. 6A illustrates the process for forming a micro-bridge by electron ray lithography, FIG. 6B illustrates the state in which a tetrahydrofuran (THF) solution is added dropwise to a system and the resulting system is then allowed to stand to form a molecular layer of the π electron conjugated system, FIG. 6C illustrates the state in which a nano-gap has been formed in the micro-bridge by electromigration, and FIG. 6D illustrates the state of molecular orientation of the molecule of the π electron conjugated system in the nano-gap, brought about by heat treatment.

DETAILED DESCRIPTION

Preferred embodiments of the present application will now be described with reference to the drawings.

Functional Molecular Element

Initially, a functional molecular element of the present application will be described.

Figure 1A:
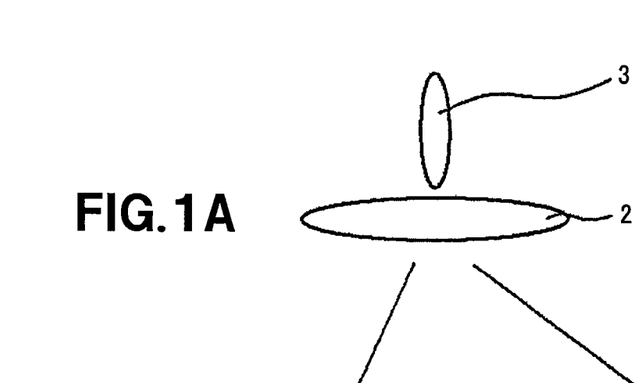
FIGS. 1A, 1B and 1C are schematic side views showing two operating modes of switching realized by the functional molecular element embodying the present application.
Figure 1B:
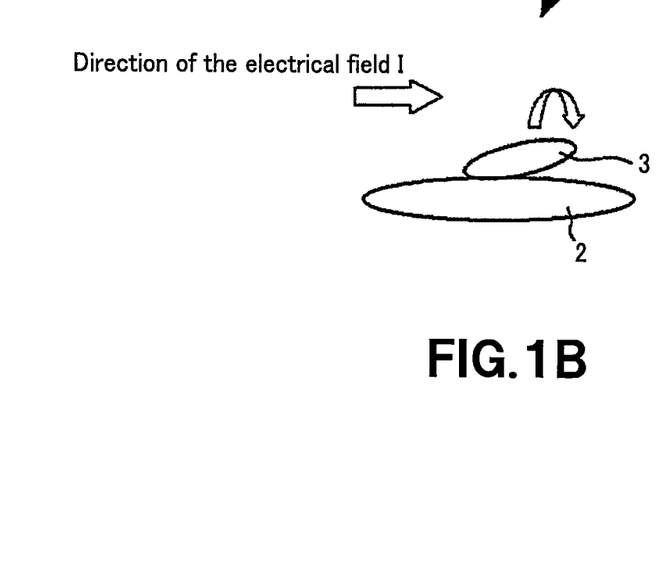
Figure 1C:
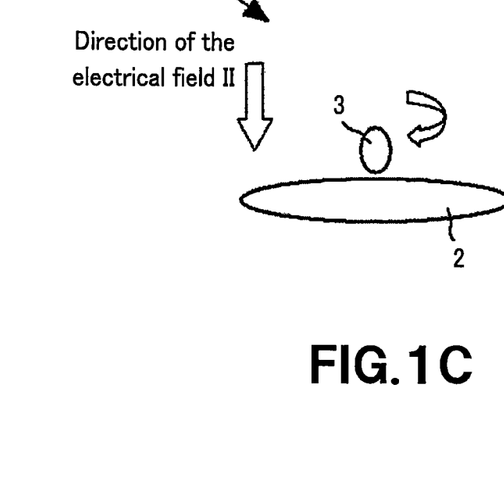

Typically of the functions of a molecular element 1, realized as the steric structure of the molecular element is changed on application of an electrical field, a switching operation may be contemplated. FIGS. 1A to 1C show such molecular element 1 employing a system in which a pendant molecule 3 of a side chain and a molecule of a conjugated system 2 of a main chain are bonded to each other by a covalent bonding. The pendant molecule 3 exhibits dielectric constant anisotropy and/or a dipole moment and is changed in orientation under the effect of an electrical field. The molecule of the conjugated system 2 is changed in its configuration and in its electrical characteristics by changes in the orientation of the pendant molecule 3.

It is noted that changes occurring in the vicinity of the covalent bond of the pendant molecule 3 and the main chain of the conjugated system 2 on application of an electrical field to the functional molecular element 1 are shown modeled in the schematic side views of FIGS. 1A to 1C. For the sake of explanation, the pendant molecule 3 is assumed to exhibit positive dielectric constant anisotropy or exhibit dipole moment along the long axis of the molecule.

The pendant molecule 3, exhibiting positive dielectric constant anisotropy, or exhibiting dipole moment along the long axis of the molecule, tends to be oriented, on application thereto of an electrical field I, indicated in FIG. 1B, in such a manner that the direction of its long axis will be aligned with the direction of the electrical field applied. In case the pendant molecule 3 exhibits negative dielectric constant anisotropy, the molecule tends to be oriented so that the direction of its short axis will be aligned with the direction of an electrical field II, as indicated in FIG. 1C. Thus, the explanation similar to the following explanation holds if the long axis direction and the shot axis direction are interchanged.

As for the dynamics of the switching operation, shown by the pendant molecule 3 at the time of application of an electrical field, two different operating modes may be contemplated, depending on the difference in the directions of application of the electrical field. This difference is shown in FIGS. 1B and 1C.

It is assumed that, in an initial state when no electrical field is applied, as shown for example in FIG. 1A, the pendant molecule 3 of the functional molecular element is arrayed with its long axis direction lying at right angles with the axial direction of the molecule of the conjugated system (main chain) 2, that is, with the left-and-right direction of FIG. 1A.

If the electrical field I is applied in a direction perpendicular to the plane of the drawing sheet, the pendant molecule 3, exhibiting positive dielectric constant anisotropy, tends to perform a swinging movement through 90°, in an attempt to align its long axis direction with the direction of the electrical field, as shown in FIG. 1B. If the electrical field ceases to be applied, the pendant molecule reverts to its original state of orientation, shown in FIG. 1A, by natural relaxation.

If, on the other hand, an electrical field is applied in the up-and-down direction, shown in FIG. 1, the pendant molecule 3, exhibiting negative dielectric constant anisotropy, tends to perform a see-saw movement, in an attempt to align its short axis direction with the direction of the electrical field, as shown in FIG. 1C. If the electrical field ceases to be applied, the pendant molecule reverts to its original state of orientation, shown in FIG. 1A, by natural relaxation.

Such change in the constitution or orientation of the pendant molecule 3, brought about by the application of the electrical field, described above, produces a change in the constitution of the covalent bond of the pendant molecule to the main chain of the conjugated system 2, as a result of which the molecular structure of the main chain of the conjugated system 2 is changed. Hence, the dihedral angle, formed by the main chain of the conjugated system 2, is changed, so that the electrical conductivity of the main chain of the conjugated system 2 is changed.

Figure 2A:
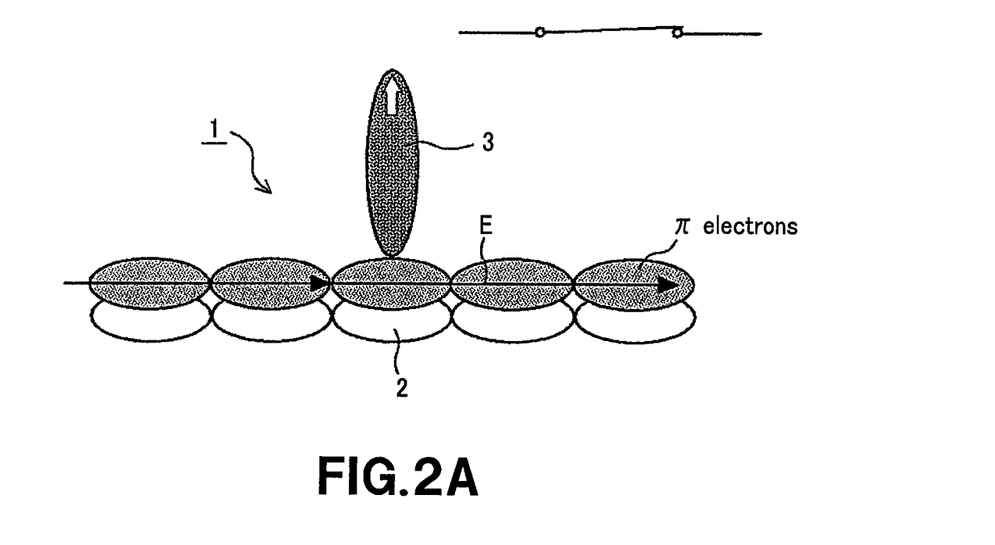
FIGS. 2A and 2B are schematic explanatory perspective views for illustrating, on the molecular level, a typical configuration of realization of the switching function of the functional molecular element, in the off-state and in the on-state of the element, respectively.
Figure 2B:
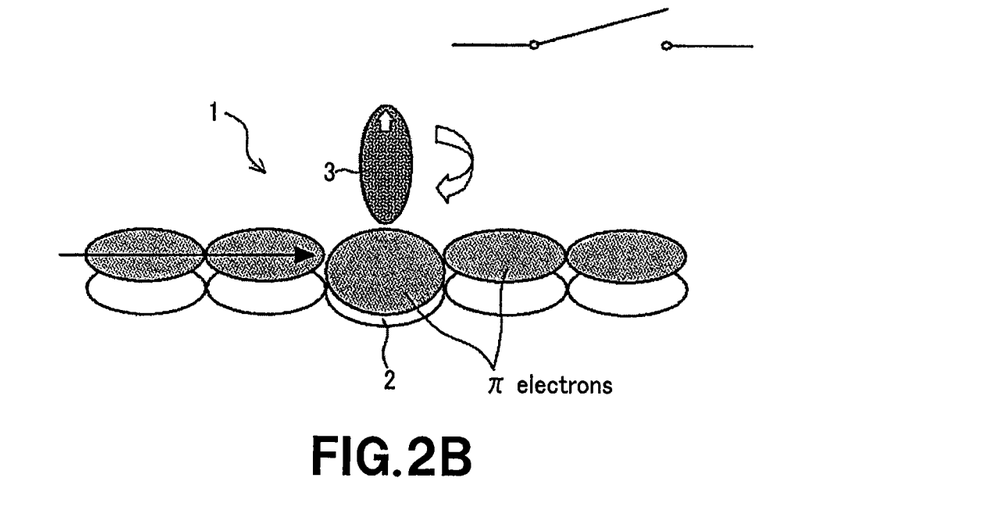

FIGS. 2A and 2B are schematic explanatory perspective views for illustrating, on the molecular level, an example of the configuration of demonstration of the switching function of the above-described functional molecular element 1. This functional molecular element 1 is made up by the linear or film-shaped main chain 2 and the pendant molecule 3 arranged as the side chain to the main chain 2. This main chain 2 is of the conjugated system and exhibits electrical conductivity by non-localized $\pi$ electrons. The pendant molecule 3 exhibits the dielectric constant anisotropy or the dipole moment, as described above.

The pendant molecule 3, exhibiting the dielectric constant anisotropy or the dipole moment, tends to be oriented, in an electrical field, in a specified direction with respect to the direction of the electrical field, specifically, in a direction in which the long axis direction of the molecule is parallel to and coincident with the direction of the electrical field, or is orthogonal to the direction of the electrical field.

Thus, by changing the electrical field, acting on the pendant molecule, the position of the pendant molecule relative to the direction of the electrical field may be changed, as a result of which the structure constituted by the pendant molecule 3 and the molecule of the conjugated system (main chain) 2 may be changed to control the electrical conductivity of the molecule of the conjugated system 2 (flow of electrons).

FIG. 2A shows a case where the dihedral angle of the molecule of the conjugated system 2 is closer to nought, representing the planar state of the molecule. In this state, a flow of electrons E through the molecule of the conjugated system, and also through molecules of the entire conjugated system, is not obstructed, and hence the functional molecular element 1 is in its ON state.

FIG. 2B shows a case where the orientation of the pendant molecule 3 has been changed, as a result of which the planarity of the dihedral angle of the molecule of the conjugated system 2 is lost. In this state, the flow of electrons through the molecule of the conjugated system, and hence through the molecules of the entire conjugated system, is obstructed by the distortion of the dihedral angle. Consequently, the functional molecular element 1 is in the OFF state.

That is, with the functional molecular element 1 of the instant embodiment, the electrical field acts on the pendant molecule 3 and modulates the electron flow through the intermediary of the pendant molecule, instead of directly acting on the molecule of the conjugated system (main chain) 2 to modulate its electrical conductivity. If the flow of electrons through the conjugated system 2, as the principal-axis molecule, is likened to the flow of water in the water main, the action of the electrical field in a conventional organic FET attempts to change the diameter of the water main. Conversely, with the instant embodiment, the action of the electrical field may be likened to acting on a handle (corresponding to a molecule of a Louis acid 4) and thus on the water main (corresponding to the pendant chain 3, that is, on the side chain) to twist the mater main (corresponding to the conjugated system or main chain 2) for opening/closing the water main.

Several combinations of the constitutions of the functional molecular element 1 may be thought of, depending on the difference in the constitutions of the molecule of the conjugated system or the pendant part.

For example, the main chain 2 may be formed of plural molecules exhibiting conjugated properties. The molecule 3, constituting the pendant part, and exhibiting dielectric constant anisotropy, may have positive dielectric constant anisotropy or negative dielectric constant anisotropy.

Field Effect Type Molecular Device

An embodiment of the field effect type molecular device will now be described.

Here, a field effect type molecular device, made up of a molecule of the conjugated system (main chain), formed of oligofluorene, and a molecule of the pendant part (side chain), exhibiting the dipole moment along the long-axis direction of the molecule, and formed of 4-pentyl-4'-cyanobiphenyl, abbreviated below to 5CB from time to time, as well as the method for fabricating the same, will now be described in detail.

The molecular structure of oligofluorene, to which 4-pentyl-4'-cyanobiphenyl is covalently bonded as a side chain, is as shown below:

[Chemical Formula 1]

Figure 3A:
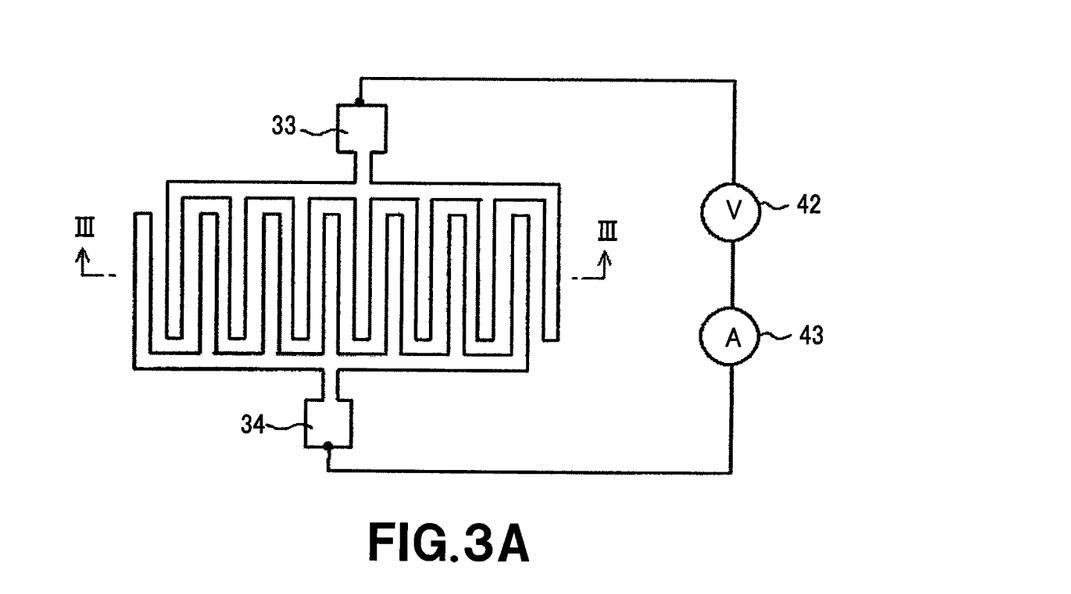
FIG. 3A is a plan view showing a field effect type molecular device and FIG. 3B is a cross-sectional view taken along line III-III of FIG. 3A.
Figure 3B:
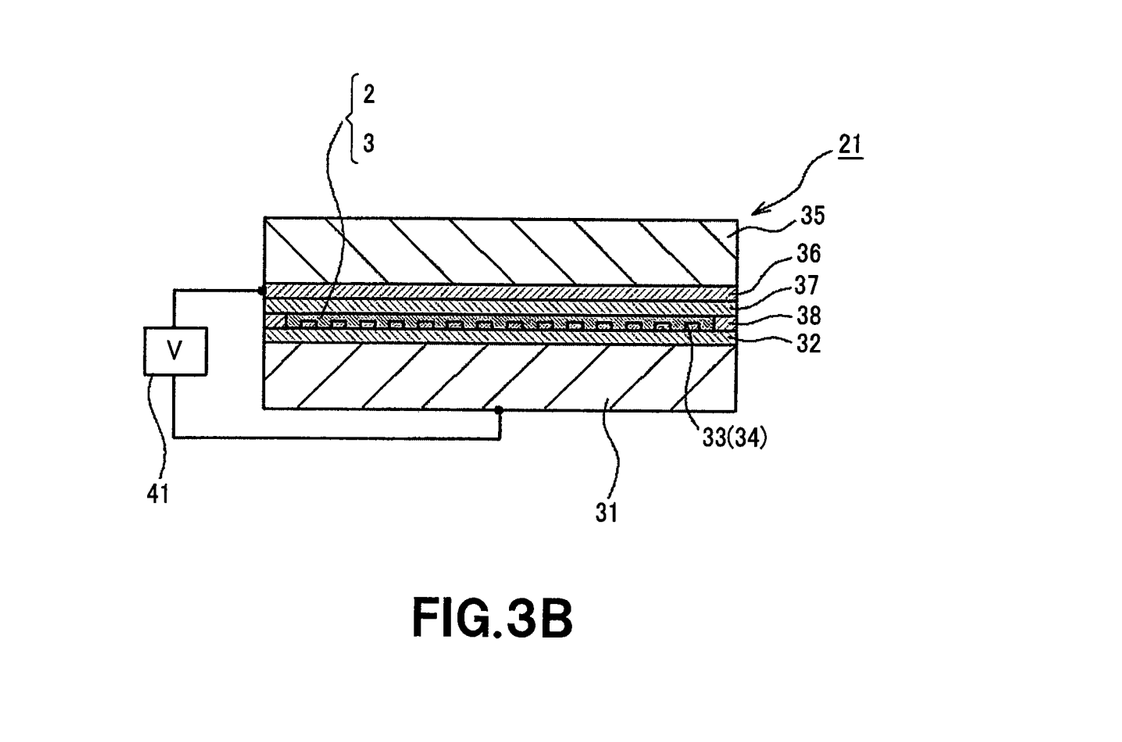

FIG. 3A depicts a plan view showing the structure of comb-shaped electrodes 33, 34, as used in the field effect type molecular device 21, and FIG. 3B is a cross-sectional view taken along line III-III of FIG. 3A.

In this field effect type molecular device 21, an insulating layer 32 is formed on a first substrate 31, used simultaneously as an electrode for applying a control electrical field. On the insulating layer 32, there are formed the comb-shaped electrodes 33, 34 used for measuring the electrical conductivity of oligofluorene. On a second substrate 35, there is formed an ITO (indium tin oxide) film 36 as another electrode for applying a control electrical field. A homogeneous orientation film 37 is layered thereon. Oligofluorene 2 and 4-pentyl-4'-cyanobiphenyl 3 are sandwiched, along with a spacer, not shown, in between the two substrates 31, 35, and have their ends sealed by a sealant 38.

The first substrate 31, simultaneously used as an electrode for applying a control electrical field, and the ITO film 36, as the other electrode for applying the control electrical field, are electrically connected to a power supply for supplying the control electrical field 41. The comb-shaped electrodes 33, 34 are electrically connected to a power supply for measuring the electrical conductivity 42 and to an ammeter 43.

Figure 4:
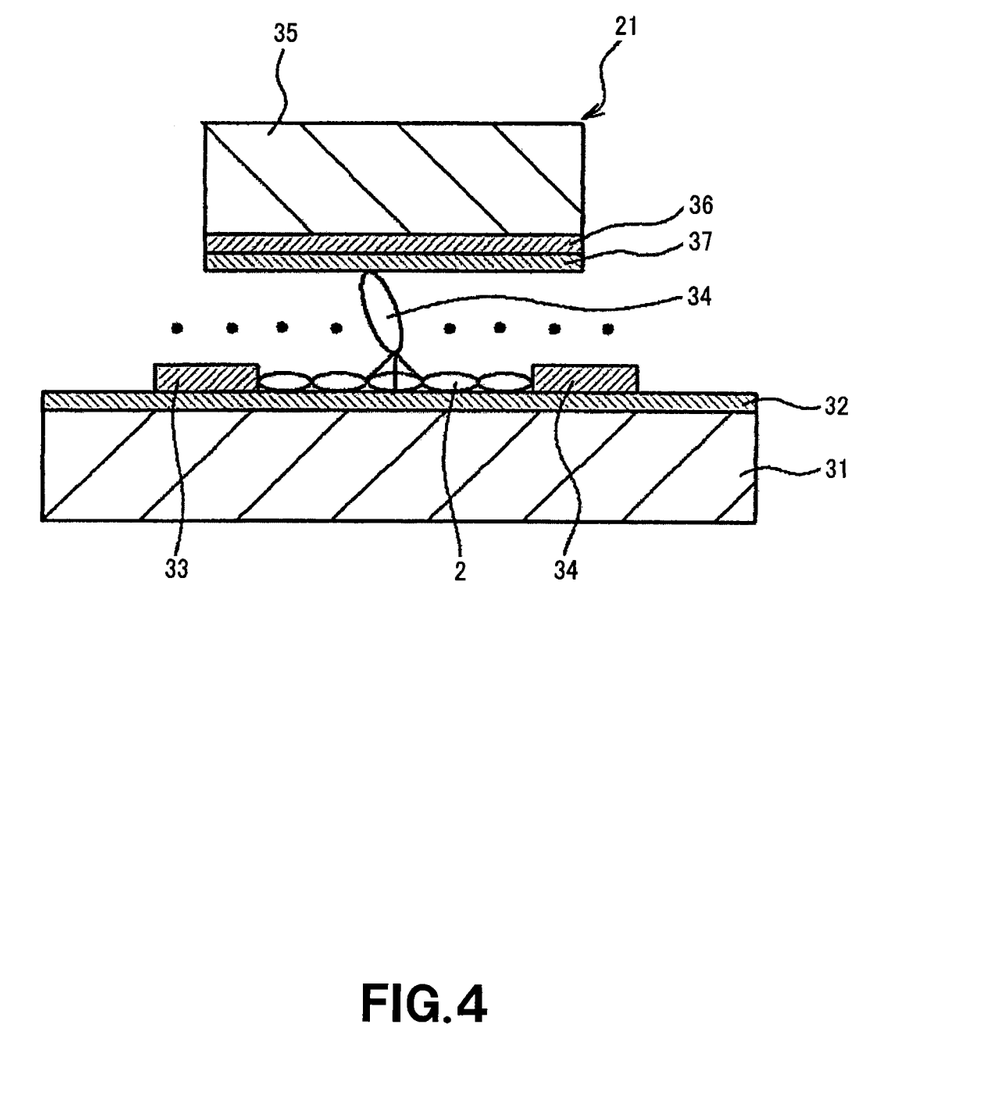
FIG. 4 is a schematic cross-sectional view showing the field effect type molecular device.

FIG. 4 depicts a schematic explanatory cross-sectional view for illustrating the structure of a field effect type molecular device 21 on the molecular level. It is noted that, although only one unit each of oligofluorene 2 and 4-pentyl-4'-cyanobiphenyl 3 are shown in FIG. 4, these are shown only as representative and, in actuality, there are provided an extremely large number of the units of the same chemical species.

Referring to FIG. 4, the process for fabricating the field effect type molecular device 21 will be explained in detail.

Initially, the electrodes 31, 36 for application of the control electrical field to 4-pentyl-4'-cyanobiphenyl 3, and the comb-shaped electrodes 33, 34, for measuring the electrical conductivity of oligofluorene 2, are fabricated.

As the first substrate 31, used simultaneously as electrode for applying the control electrode, a silicon substrate, doped to a high concentration, is used, as an example. A silicon oxide film is formed by thermal oxidation on the surface of the first substrate 31 for use as the insulating layer 32. The comb-shaped electrodes 33, 34 are formed by e.g. sputtering on the insulating layer 32.

As a second substrate 35, a glass substrate, for example is used. On the surface of the glass substrate, an ITO (indium tin oxide) film 36 is formed, such as by vapor deposition in vacuum, for use as another electrode for application of the control electrical field.

On the ITO film 36, an organic high molecular film, such as polyvinyl alcohol or polyimide, is coated, or a silicon oxide film is vapor-deposited, for use as insulating film 37.

The components of the functional molecular element are then built in between the two electrodes for completing the major portion of the field effect type molecular device 21 which allows for measurement of modulation of electrical conductivity.

An oligofluorene derivative, made up of oligofluorene 2 having the pendant molecule 3 of 5CB as a side chain, and a group or groups, such as thiol group or groups, susceptible to bonding to the gold electrodes 33, 34, and which have been bonded to the terminal end(s) of oligofluorene 2, is adjusted to 1 mM, using tetrahydrofuran as solvent.

The first substrate 31 was placed in a desiccator saturated with tetrahydrofuran vapor. The above solution of the oligofluorene derivative was applied dropwise and the resulting system was allowed to stand for about ten minutes. The first substrate was then washed with a tetrahydrofuran solution to remove excess oligofluorene.

The first substrate 31 and the second substrate 35 were then bonded together so that the insulating film 37 formed on the second substrate 35 will be intimately contacted with the oligofluorene derivative layer (stacked layer of the 5CB layer and the oligofluorene layer) on the first substrate 31.

Finally, the ends of the substrates 31, 35, thus bonded together, are sealed with a sealant material 38, such as epoxy resin, to complete the field effect type molecular device 21.

If the electrical conductivity of the oligofluorene molecular chain between the comb-shaped electrodes 33, 34 was measured, as the voltage applied to the electrodes for application of the control electrical field 31, 36 of the field effect type molecular device 21, prepared as described above, was turned on-off, there was observed an action of modulation in which the resistance is low on application of the electrical field and is increased on turning the electrical field off.

In an initial state of orientation before application of the electrical field, the molecular chain is oriented by π-π stacking in substantially the same direction between biphenyl rings of the 5CB side chain. The oligofluorene main chain is stabilized in a distorted state with a dihedral angle of approximately 72°. 5CB is a molecule exhibiting dipole moment, derived from a cyano group, along a direction of the long axis of the molecule. In the field effect type molecular device 21, shown in FIGS. 3 and 4, the electrical field is applied along a direction corresponding to the up-and-down direction on the drawing sheet. Hence, the operating mode of the pendant part 3 is the see-saw type operation shown in and described with reference to FIG. 1C. In the state of 5CB, shown in FIG. 4, it is in an upstanding state, shown in FIG. 2A, as a result of application of the driving voltage. This state is the on-state or the low-resistance state. When the electrical field is turned off, the state of 5CB is as shown in FIG. 2B, that is, an off-state or a high-resistance state.

Figure 5:
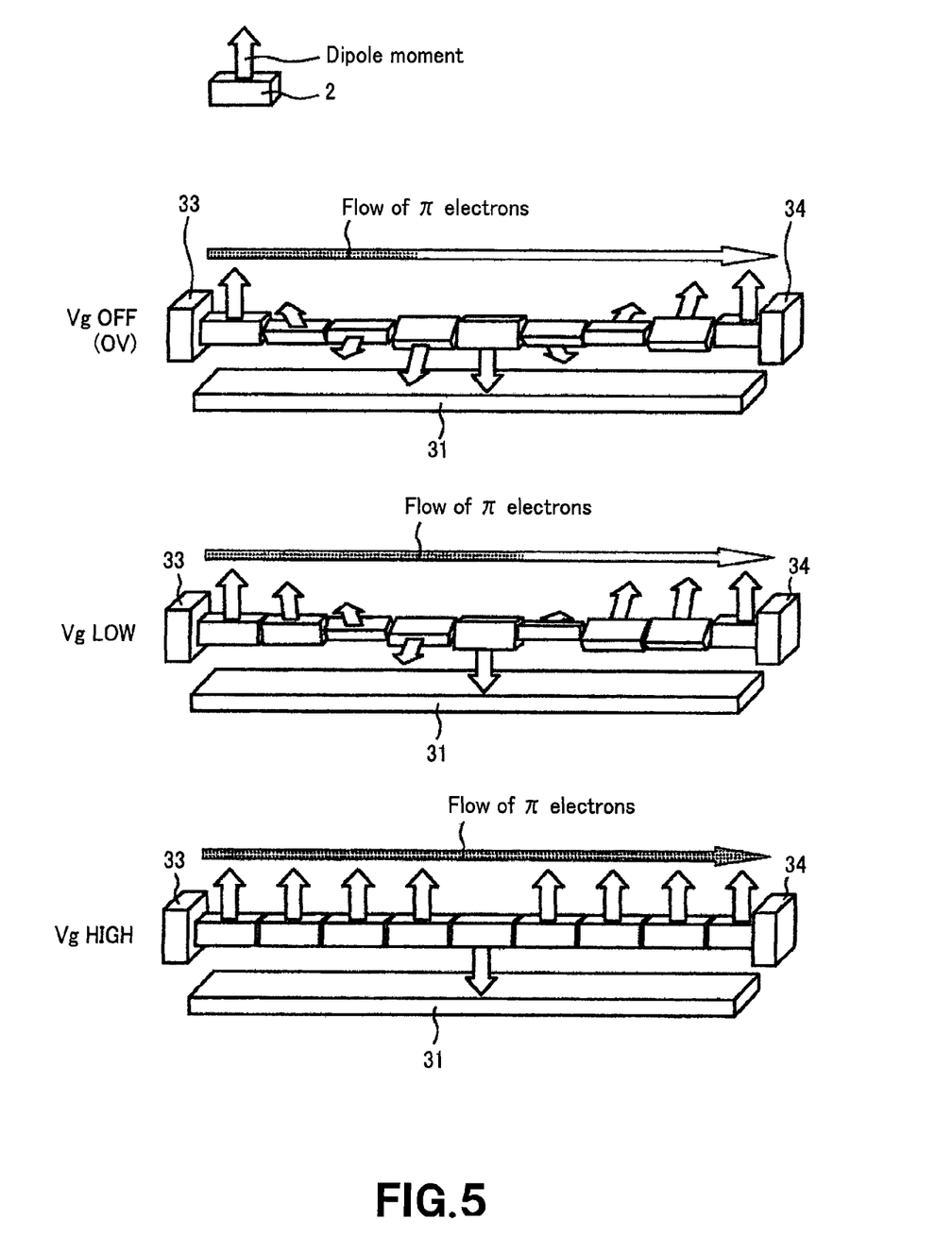
FIG. 5 is an explanatory view for illustrating the control mechanism for the dihedral angle of a molecule of a π electron conjugated system (oligofluorene; main chain) by an external electrical field in the field effect type molecular device according to an embodiment of the present application.

The reason the electrical conductivity is modulated as a result of application of an electrical field is as follows: Before application of the electrical field, with the gate voltage Vg being 0V, the oligofluorene main chain assumes the moderately twisted helical structure, in a stabilized state, due to packing between neighboring 5CB side chains, as schematically shown in FIG. 5. As 5CB is changed in orientation, due to application of the electrical field, the overall structure, inclusive of the oligofluorene main chain, which has been in stabilized state, is changed. With increase in the gate voltage, the dihedral angle of the oligofluorene main chain is changed, as a result of which electrical conductivity is demonstrated. Meanwhile, it is known that, in oligofluorene, the stable dihedral angle is changed from one particular side chain to another.

Since the polymerization degree of oligofluorene, used in the present embodiment, is approximately 7, the length of oligofluorene is not larger than 7 nm, viz., the element is of the molecular level.

Thus, the present embodiment provides a novel functional molecular element in which a molecule exhibiting dielectric constant anisotropy or dipole moment is covalently bonded to a molecule of the linear conjugated system, in the form of a pendant, and in which the orientation of the pendant is changed relative to the direction of the electrical field, as a result of application of an electrical field. In this manner, the structure of the overall molecule is modulated to control the electrical conductivity of the electrically conductive principal-axis molecule, that is, the flow state of electrons.

The above-described functional molecular element causes the state of orientation of the molecule of the pendant part 3 to be changed, just as a tap of the water main is rotated to control the water flow in the water main. That is, a molecular element is realized from a wholly new perspective, in distinction from the element of the related art in which a molecule itself is thought of as an element and the state of electrons in the molecule is changed to induce changes in electrical conductivity.

The above principle may apply to all of molecules of the conjugated system. That is, electrically conductive oligomers, other than oligofluorene, namely oligopyridine, porphiline one-dimensional oligomer, oligophenylene vinylene, oligoparaphenylene, oligonaphthalene, oligoanthracene, oligopyrene, oligoazulene, oligofuran, oligothiophene, oligoselenophene, oligo (paraphenylene sulfide), oligo (paraphenylene oxide) or oligoaniline, may be used. High-molecular materials may, of course, be used. Additionally, the oligomers having the polymerization degree equal to 20 or less may be used. Monomers may also be used, as the case may be. Carbon molecules, having the π electron conjugated system, such as carbon nano-tubes, may also be used.

As pendant molecules, responding to the electrical field, there may be recited the molecules containing carbonyl groups (C=O), exhibiting the dipole moment, halogens, such as —Cl, =N—H group, —OH group or =C=S group, in addition to the cyano group based molecules different from the aforementioned 4-pentyl-4'-cyanobiphenyl.

The molecular element may be applied to a variety of electronic devices, such as switches, transistors, memories or logic circuits.

In addition to the advantages that elements of variable sizes, ranging from the elements of the usual size to the nanometer-order elements, may be fabricated from the molecules of the same material, and that the molecule suited to an objective in view may be selected from among the molecules of a large variety of materials, the following may be pointed out as advantages of the above-described functional molecular element and device, formed of e.g. the organic molecule, according to the present application.

1. Low power consumption;
2. no limitation to the driving frequency used;
3. low pollution; and
4. multiple functions that may be achieved.

As for 1 above, since the unit of the operation is one molecule or one electron, operation is basically possible with low power consumption and low heat evolution, so that there is scarcely raised the problem related with heating even if the integration degree is raised.

As for 2 above, high-speed response characteristics, exceeding those of the conventional inorganic semiconductor crystal, may be expected by ingenuous selection or designing of the materials or the structure, as may be testified from recent improvement in high-speed response characteristics of liquid crystal materials.

As for 3 above, since the organic molecule for use as the functional molecular element may be synthesized by the routine method for synthesis of organic compounds, there is no necessity for using reagents deleterious to humans or to environments, such as those used in a fabrication process for inorganic semiconductors.

As for 4 above, it is possible to realize the functions, not achievable so far, such as a taste sensor or an odor sensor, on the premises that characteristics of a large variety of organic molecules are exploited.

Example 1

As an example of the present application, the case of fabrication of a field effect type molecular device 21, shown in FIGS. 3 and 4, will now be described in detail.

Initially, the electrodes 31, 36 for applying a control electrical field to 4-pentyl-4'-cyanobiphenyl 3, and the electrodes 33, 34 for measuring the electrical conductivity of oligofluorene 2, were fabricated.

As the first substrate (electrode for applying the control electrical field) 31, a silicon substrate, doped to a high concentration, was used. The surface of the first substrate 31 was processed with heating to form a thin film of silicon oxide which then was used as an insulating film. The comb-shaped electrodes 33, 34 of gold were formed by sputtering on the insulating film 32 for use as electrodes for measuring the electrical conductivity of oligofluorene 2.

The ITO electrode 36, as another electrode for applying a control electrical field, was formed by vacuum deposition on the second substrate (glass substrate) 35. The homogeneous orientation film 37, used simultaneously as an insulating film, was formed on the ITO electrode 36. Polyvinyl alcohol was used as an orientation film material. A 10 wt % aqueous solution of polyvinyl alcohol was prepared and applied by spin coating on the ITO electrode 36. The resulting system was heated at 110° C. for 30 minutes.

An oligofluorene derivative, made up of oligofluorene 2 having the pendant molecule 3 of 4-pentyl-4'-cyanobiphenyl (5CB) as a side chain, and a thiol group or groups, susceptible to bonding to the gold electrodes, and which have been attached to the terminal end(s) of oligofluorene 2, was prepared on a substrate for fabrication of the oligofluorene 2, to a concentration of 1 mM, using tetrahydrofuran as solvent.

The first substrate 31 was placed in a desiccator, saturated with tetrahydrofuran vapor. The above solution of the oligofluorene derivative molecules was supplied dropwise to the system, and the resulting system was allowed to stand for about 10 minutes. The resulting system was then rinsed with a tetrahydrofuran for removing excess oligofluorene.

The first substrate 31 and the second substrate 35 were bonded together, via a spacer, so that the insulating film 37, formed on the second substrate 35, will be in intimate contact with the molecular layer of the oligofluorene derivative molecules (stacked layer of the 5CB layer and the oligofluorene layer) on the first substrate 31.

Finally, the ends of the substrates 31, 35, thus bonded together, were sealed with a sealant material, such as epoxy resin, to complete the field effect type molecular device 21.

Measurements were made of the electrical conductivity of the oligofluorene molecular chain between the comb-shaped electrodes 33, 34, as the voltage applied to the electrodes for application of the control electrical field 31, 36 of the field effect type molecular device 21 was turned on-off. The results of the measurements indicated an action of modulation in which the resistance is high during the electrical field off time and is decreased on application of the electrical field.

Comparative Example 1

In the following, Comparative Examples, for contrasting to the Examples of the present application, are shown.

In the Comparative Example 1, a field effect type molecular device, similar to one shown in FIG. 4, was fabricated. In this field effect type molecular device, ethyl hexyl oligofluorene, with the polymerization degree of approximately 20, not exhibiting permanent dipole moment in its side chain, was incorporated as a molecule of the conjugated system (main chain). This device was fabricated in the following manner.

The molecular structure of ethyl hexyl oligofluorene, with a thiol terminal, as used here, is as follows:

[Chemical Formula 2]

Oligofluorene (main chain)

Ethyl hexyl group (side chain)

Figure 6A:
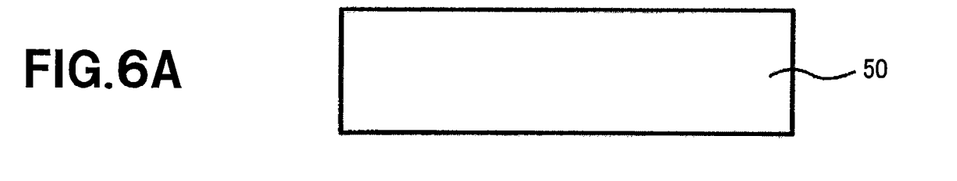
FIGS. 6A to 6D are plan views for illustrating the fabrication process for a field effect molecular device of a Comparative Example, as contrasted to the present application.

A nano-gap, which becomes a channel part, is formed between source and drain electrodes, as facing electrodes. These electrodes were fabricated, taking H. Park et al., Applied Physics Letters, Vol. 75, 301 (1999) into consideration. That is, a SiO2 layer 32 was initially formed on an electrically conductive silicon substrate 31 to a thickness of 500 nm. On this SiO2 layer were then formed a chromium layer (5 nm thickness) and a gold electrode layer (30 nm thickness). The chromium layer/gold electrode layer were then processed to the shape of a micro-bridge 50, with a width of 20 to 30 nm, by electron ray lithography, as shown in FIG. 6A.

Figure 6B:
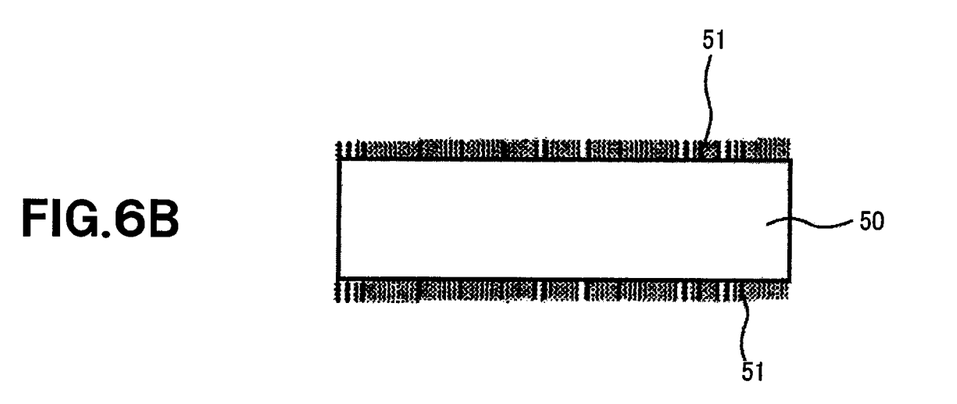

On this micro-bridge, 1 μl of a 0.1 mM solution in tetrahydrofuran (THF) of ethyl hexyl oligofluorene was applied dropwise. The resulting system was allowed to stand for 48 hours under the THF-saturated vapor pressure to form a self-assembled monolayer (SAM) 51, as shown in FIG. 6B.

Figure 6C:
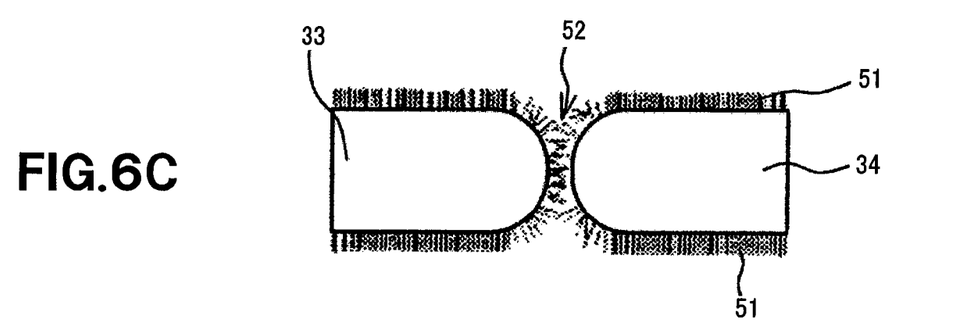

A voltage of approximately 15V was applied across both ends of the so dried micro-bridge 50 to break the micro-bridge 50 by electromigration to form a nano-gap 52 between the facing electrodes 33, 34 obtained on breakage of the micro-bridge.

Figure 6D:
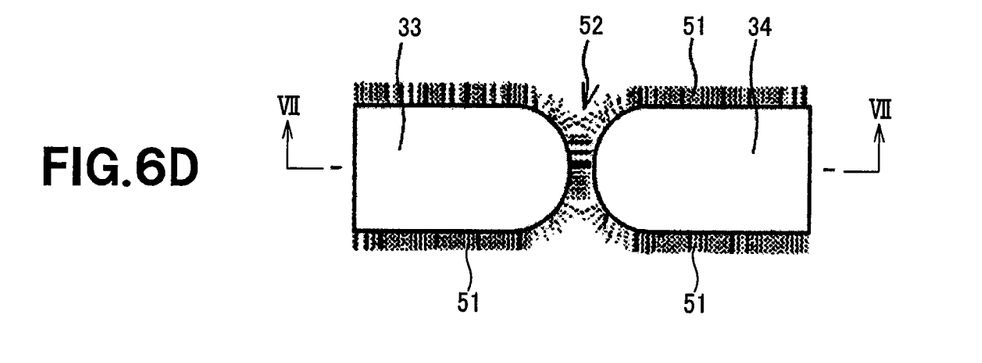

The temperature was then raised to 350K, under an argon atmosphere, whereby the molecule of the conjugated system 51 was turned into a liquid crystal phase. Within the nano-gap 52, optimum molecular orientation, in which the molecules were arrayed along the facing direction of the facing electrodes 33, 34, could be realized in the nano-gap 52, as shown in FIG. 6D.

Figure 7:
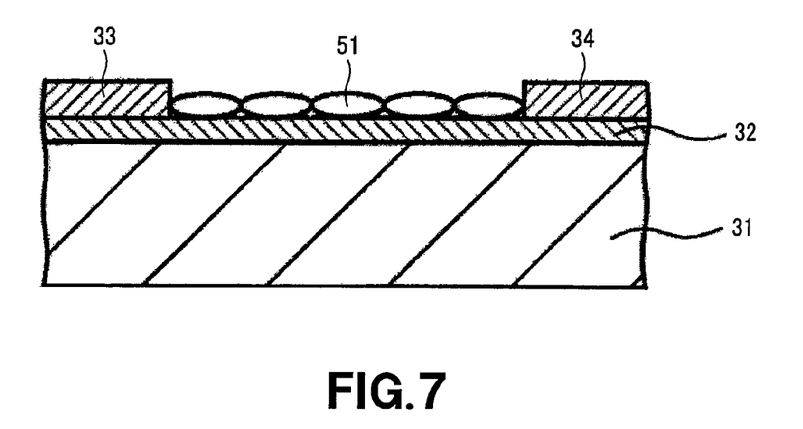
FIG. 7 is a cross-sectional view taken along line IIV-IIV of FIG. 6D.

FIG. 7 depicts the cross-sectional view of the so fabricated field effect type molecular device.

Figure 8:
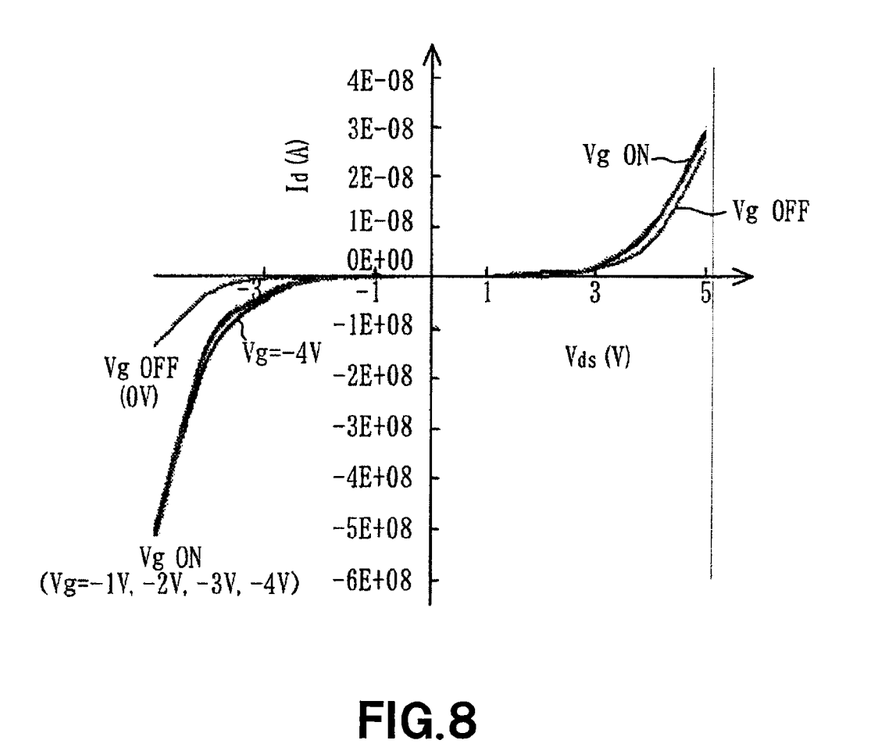
FIG. 8 is a graph showing an FET characteristic curve (Id-Vds curve) of a molecular device.

Measurements of the FET characteristics of the sample device, thus prepared, indicated that, similarly to macro-scale FET characteristics (see M. Heeney et al., Macromolecules, 37, 5250 (2004)), the FET characteristics of ethyl hexyl oligofluorene, not exhibiting dipole moment in its side chain, indicated p-type semiconductor characteristics, as shown in FIG. 8.

Example 2

Another Example of the present application will now be explained. In this Example, a field effect type molecular device, used in the second embodiment described above, composed of oligofluorene as a molecule of the conjugated system (main chain) and 4-pentyl-4'-cyanobiphenyl (5CB) as a pendant molecule (side chain), exhibiting dipole moment in a direction along the long axis of the molecule, was fabricated in the same way as explained in the above-described Comparative Example 1.

Figure 9:
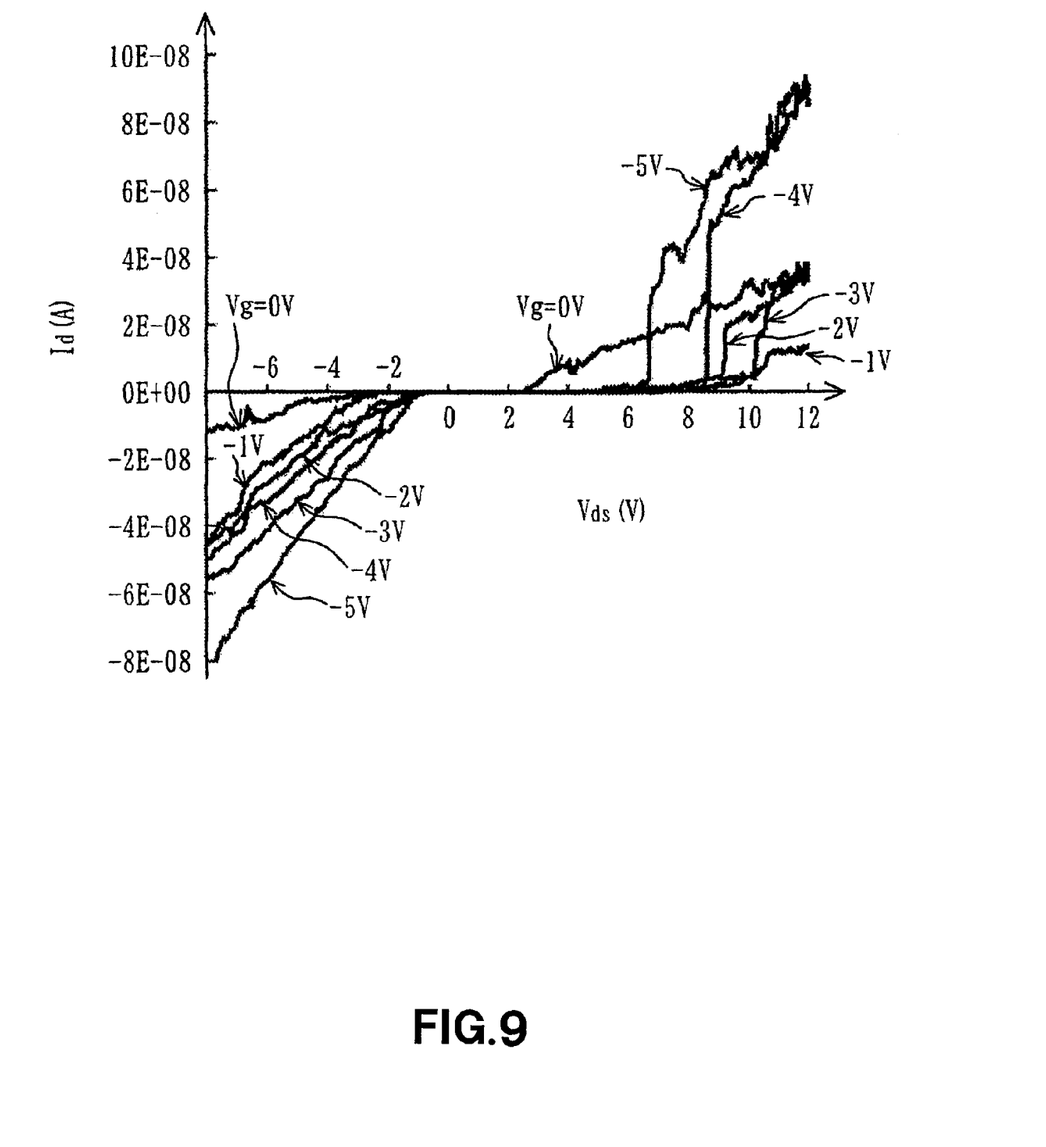
FIG. 9 is a graph showing an FET characteristic curve (Id-Vds curve) of a molecular device of Example 2 of the present application.
Figure 10:
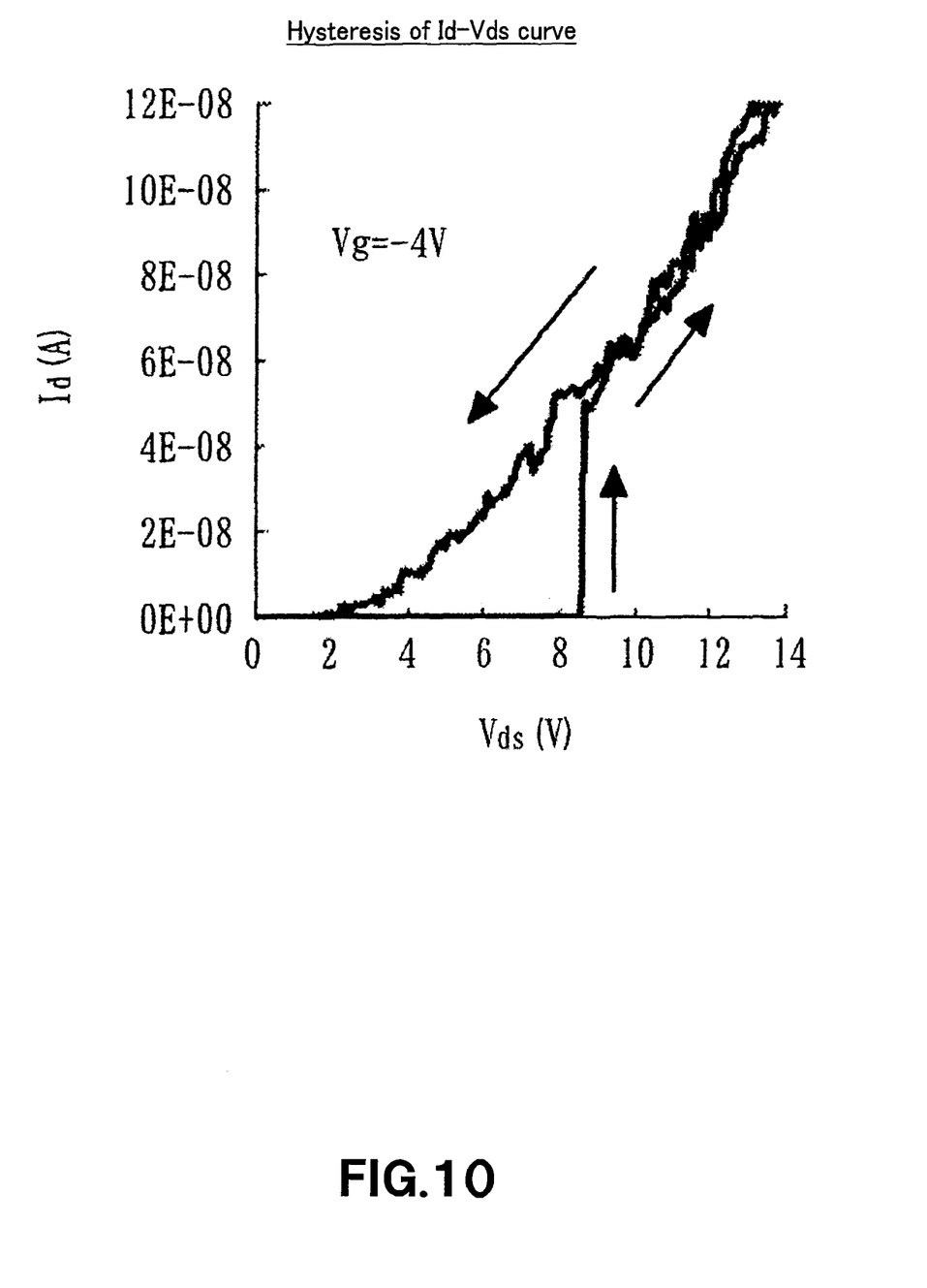
FIG. 10 is a graph showing the hysteresis of the Id-Vds curve in the graph showing FET characteristics of the molecular device of Example 2 of the present application.

The molecular device, fabricated with the present Example, with the use of 5CB, exhibiting dipole moment in its side chain, and oligofluorene, displayed peculiar FET characteristics such as are shown in FIGS. 9 and 10. These characteristics are such that, when no gate voltage is applied, the current is increased monotonously with increase in the drain voltage Vds, and such that, when the gate voltage is applied, the current value is increased steeply at a certain drain voltage Vds. These steep threshold characteristics depend on the gate voltage, while the current value reached also depends on the gate voltage. Also, measurements of the hysteresis curve have revealed that, while the steep characteristics are displayed during rise in the voltage, the current is decreased monotonously during voltage decrease, beginning from the current value reached.

It is to be noted that the embodiments explained with reference to the drawings are merely illustrative and that, as will be apparent to those skilled in the art, a wide variety of changes or substitutions by equivalents may be attempted without departing from the scope and the purport of the application as defined in the claims.

Industrial Applicability

The functional molecular element and the functional molecular device, which are based on the novel operating mechanism of the electrical field, according to the present application, may be applied to a wide variety of electronic devices, such as switches, transistors, memories or logic circuits, which may be fabricated in a wide size range from conventional macro-sized devices to nanometer-scale devices, using the same material and on the basis of the same principle.

It should be understood that various changes and modifications to the presently preferred embodiments described herein will be apparent to those skilled in the art. Such changes and modifications can be made without departing from the spirit and scope of the present application and without diminishing its intended advantages. It is therefore intended that such changes and modifications be covered by the appended claims.

The invention claimed is:

1. A functional molecular element employing a system comprising:
a first molecule having dielectric constant anisotropy and/or dipole moment and having the orientation changed under the operation of an electrical field; and
another molecule of a conjugated system having electrical properties changed as a result of a change in structure brought about by said change in orientation of said first molecule,
wherein the conjugated system comprises an electrically conductive oligomer composed of molecules of the conjugated system, the molecular structure and electrical conductivity of a main chain of the conjugated system is configured to change based on the change in orientation of said first molecule such that the functional molecular element switches between an on state and an off state,
wherein the change in structure of the molecule of a conjugated system having electrical properties brought about by said change in orientation of said first molecule is a conformational change.

2. The functional molecular element according to claim 1 wherein a side chain formed by said first molecule, as a pendant molecule, exhibiting dielectric constant anisotropy and/or dipole moment, is covalently bonded to the main chain formed by said molecule of the conjugated system.

3. The functional molecular element according to claim 2 wherein said molecule of the conjugated system includes a fluorene skeleton.

4. The functional molecular element according to claim 2 wherein said pendant molecule includes a cyanobiphenyl skeleton.

5. The functional molecular element of claim 1, wherein the electrically conductive oligomer is an oligofluorene, oligopyridine, porphiline one-dimensional oligomer, oligophenylene vinylene, oligoparaphenylene, oligonaphthalene, oligoanthracene, oligopyrene, oligoazulene, oligofuran, oligothiophene, oligoselenophene, oligo(paraphenylene sulfide), oligo(paraphenylene oxide) or oligoaniline.

6. The functional molecular element of claim 1, wherein the electrically conductive oligomer has a degree of polymerization of 20 or less.

7. The functional molecular element of claim 1, wherein the conjugated system is an electrically conductive oligofluorene with a degree of polymerization of 7.

8. The functional molecular element of claim 1, wherein the conformational change results in a change in the dihedral angle formed by the main chain of the conjugated system.

9. A functional molecular device comprising:
a system composed of a first molecule having dielectric constant anisotropy and/or dipole moment and having the orientation changed under the operation of an electrical field and another molecule of a conjugated system having electrical properties changed as a result of a change in structure brought about by said change in orientation of said first molecule, wherein the conjugated system comprises an electrically conductive oligomer composed of molecules of the conjugated system, the molecular structure and electrical conductivity of a main chain of the conjugated system is configured to change based on the change in orientation of said first molecule such that the functional molecular element switches between an on state and an off state;
electrical field applying means for applying an electrical field to said first molecule exhibiting dielectric constant anisotropy and/or dipole moment; and
input/output means for said other molecule of the conjugated system,
wherein the change in structure of the molecule of the conjugated system having electrical properties brought about by said change in orientation of said first molecule is a conformational change.

10. The functional molecular device according to claim 9 wherein said first molecule exhibiting dielectric constant anisotropy and/or dipole moment is oriented on an electrode adapted for applying said electrical field, and wherein said molecule of the conjugated system is arranged at least in between facing electrodes, an output corresponding to said electrical field being taken out from at least one of the facing electrodes.

11. The functional molecular device according to claim 10 wherein an electrically conductive path is formed by the molecule of the conjugated system and wherein electrical conductivity of said electrically conductive path is controlled by changes in the electrical field acting on said first molecule exhibiting said dielectric constant anisotropy and/or dipole moment.

12. The functional molecular device according to claim 11 wherein the position relationships of said first molecule exhibiting said dielectric constant anisotropy and/or dipole moment are changed by changes in said electrical field acting on said first molecule exhibiting said dielectric constant anisotropy and/or dipole moment to cause changes in an angle defined between said first molecule and said molecule of the conjugated system.

13. The functional molecular device according to claim 11 wherein the layer of said molecule of the conjugated system and the layer of said first molecule exhibiting dielectric constant anisotropy and/or dipole moment form a stacked layer.

14. The functional molecular device according to claim 13 wherein an insulating layer is formed on a first electrode, and a second electrode and a third electrode are formed on said insulating layer so that said second and third electrodes are not contacted with each other, said stacked layer being arranged at least between said second and third electrodes, and wherein a fourth electrode is arranged, either directly or via an insulating layer, on a layer of said molecule of said stacked layer exhibiting dielectric constant anisotropy and/or dipole moment.

15. The functional molecular device according to claim 9 wherein a side chain formed by said pendant molecule exhibiting dielectric constant anisotropy and/or dipole moment is covalently bonded to the main chain formed by said molecule of the conjugated system.

16. The functional molecular device according to claim 15 wherein said molecule of the conjugated system has a fluorene skeleton.

17. The functional molecular device according to claim 15 wherein said pendant molecule has a cyanobiphenyl skeleton.

18. The functional molecular device of claim 9, wherein the electrically conductive oligomer is one or more of an oligofluorene, oligopyridine, porphiline one-dimensional oligomer, oligophenylene vinylene, oligoparaphenylene, oligonaphthalene, oligoanthracene, oligopyrene, oligoazulene, oligofuran, oligothiophene, oligoselenophene, oligo(paraphenylene sulfide), oligo(paraphenylene oxide) or oligoaniline.

19. The functional molecular device of claim 9, wherein the electrically conductive oligomer has a degree of polymerization of 20 or less.

20. The functional molecular device of claim 9, wherein the conjugated system is an electrically conductive oligofluorene with a degree of polymerization of 7.

21. The functional molecular device of claim 9, wherein the conformational change results in a change in the dihedral angle formed by the main chain of the conjugated system.

22. A transistor comprising a functional molecular element, the functional molecular element including:
a first molecule having dielectric constant anisotropy and/or dipole moment and having the orientation changed under the operation of an electrical field; and
another molecule of a conjugated system having electrical properties changed as a result of a change in structure brought about by said change in orientation of said first molecule,
wherein the conjugated system comprises an electrically conductive oligomer composed of molecules of the conjugated system, the molecular structure and electrical conductivity of a main chain of the conjugated system is configured to change based on the change in orientation of said first molecule such that the functional molecular element switches between an on state and an off state,
wherein the change in structure of the molecule of a conjugated system having electrical properties brought about by said change in orientation of said first molecule is a conformational change.

23. A functional molecular device comprising:
a system composed of a first molecule having dielectric constant anisotropy and/or dipole moment and having the orientation changed under the operation of an electrical field and another molecule of a conjugated system having electrical properties changed as a result of a change in structure brought about by said change in orientation of said first molecule, wherein the conjugated system comprises an electrically conductive oligomer composed of molecules of the conjugated system, the molecular structure and electrical conductivity of a main chain of the conjugated system is configured to change based on the change in orientation of said first molecule such that the functional molecular element switches between an on state and an off state;
electrical field applying means for applying an electrical field to said first molecule exhibiting dielectric constant anisotropy and/or dipole moment; and
input/output means for said other molecule of the conjugated system,
wherein the electrically conductive oligomer is one or more of an oligofluorene, oligopyridine, porphiline one-dimensional oligomer, oligophenylene vinylene, oligoparaphenylene, oligonaphthalene, oligoanthracene, oligopyrene, oligoazulene, oligofuran, oligothiophene, oligoselenophene, oligo(paraphenylene sulfide), oligo(paraphenylene oxide) or oligoaniline.

24. A functional molecular device comprising:
a system composed of a first molecule having dielectric constant anisotropy and/or dipole moment and having the orientation changed under the operation of an electrical field and another molecule of a conjugated system having electrical properties changed as a result of a change in structure brought about by said change in orientation of said first molecule, wherein the conjugated system comprises an electrically conductive oligomer composed of molecules of the conjugated system, the molecular structure and electrical conductivity of a main chain of the conjugated system is configured to change based on the change in orientation of said first molecule such that the functional molecular element switches between an on state and an off state;
electrical field applying means for applying an electrical field to said first molecule exhibiting dielectric constant anisotropy and/or dipole moment; and
input/output means for said other molecule of the conjugated system,
wherein the electrically conductive oligomer has a degree of polymerization of 20 or less.

* * * * *